(12) United States Patent
Miller et al.

(10) Patent No.: US 7,883,833 B2
(45) Date of Patent: *Feb. 8, 2011

(54) USE OF HIGHLY ALKALINE DEVELOPER REGENERATOR COMPOSITION

(75) Inventors: Gary R. Miller, Fort Collins, CO (US); Melanie Roth, Loveland, CO (US); Eric E. Clark, Loveland, CO (US)

(73) Assignee: Eastman Kodak Company, Rochester, NY (US)

( * ) Notice: Subject to any disclaimer, the term of this patent is extended or adjusted under 35 U.S.C. 154(b) by 82 days.

This patent is subject to a terminal disclaimer.

(21) Appl. No.: 11/765,490

(22) Filed: Jun. 20, 2007

(65) Prior Publication Data

US 2008/0318162 A1 Dec. 25, 2008

(51) Int. Cl.
*G03F 7/00* (2006.01)
*G03F 7/26* (2006.01)

(52) U.S. Cl. .................. 430/302; 101/463.1; 430/434

(58) Field of Classification Search .............. 430/302
See application file for complete search history.

(56) References Cited

U.S. PATENT DOCUMENTS

| | | | |
|---|---|---|---|
| 3,650,745 A | 3/1972 | Hackmann et al. | |
| 4,259,434 A | 3/1981 | Yamasue et al. | |
| 4,469,776 A | 9/1984 | Matsumoto et al. | |
| 4,592,992 A | 6/1986 | Hsieh et al. | |
| 4,678,596 A * | 7/1987 | Dupre et al. ............ | 510/514 |
| 4,822,723 A | 4/1989 | Dhillon | |
| 4,945,030 A | 7/1990 | Turner et al. | |
| 5,234,796 A | 8/1993 | Shimura et al. | |
| 5,250,393 A | 10/1993 | Imai et al. | |
| 5,380,623 A | 1/1995 | Miller et al. | |
| 5,480,762 A | 1/1996 | Toyama et al. | |
| 5,670,294 A | 9/1997 | Piro | |
| 5,851,735 A | 12/1998 | Miller et al. | |
| 6,143,479 A * | 11/2000 | Fiebag et al. ............ | 430/331 |
| 6,255,042 B1 * | 7/2001 | Fiebag et al. ............ | 430/331 |
| 6,364,544 B1 * | 4/2002 | Sasayama et al. ......... | 396/578 |
| 6,992,688 B2 * | 1/2006 | Shimazu et al. .......... | 347/171 |
| 7,147,995 B2 | 12/2006 | Takamiya | |
| 2005/0079452 A1 * | 4/2005 | Miller et al. ............ | 430/434 |
| 2005/0123853 A1 * | 6/2005 | Munnelly et al. ........ | 430/270.1 |
| 2006/0166146 A1 * | 7/2006 | Miller et al. ............ | 430/399 |

FOREIGN PATENT DOCUMENTS

| | | |
|---|---|---|
| EP | 0 323 836 | 9/1994 |
| EP | 1503247 | 2/2005 |
| EP | 1522898 | 4/2005 |
| WO | 2006/037716 | 4/2006 |
| WO | WO 2007/023336 A2 * | 1/2007 |
| WO | 2007/023336 | 3/2007 |

* cited by examiner

*Primary Examiner*—Cynthia H Kelly
*Assistant Examiner*—Chanceity N Robinson
(74) *Attorney, Agent, or Firm*—J. Lanny Tucker

(57) ABSTRACT

A method for providing a lithographic printing plate includes developing an exposed imageable element with an alkali silicate-containing developer composition having a pH of at least 12.0. The developer composition is regenerated by adding to it an alkali silicate-containing regenerator composition having a pH of at least 12.0. Conductivity of both the developer and regenerator compositions is suppressed from the presence of one or more conductivity reducing agents (such as glycerin). This conductivity suppression in the developer composition is greater than the suppression of the conductivity of the regenerator composition.

11 Claims, No Drawings

USE OF HIGHLY ALKALINE DEVELOPER REGENERATOR COMPOSITION

FIELD OF THE INVENTION

This invention relates in general to lithography and in particular to a method for providing lithographic printing plates, particularly from positive-working imageable elements, using a regenerator composition that is added to a developer composition.

BACKGROUND OF THE INVENTION

Recent developments in the field of printing plate precursors concern the use of imageable layer compositions that can be imaged by means of lasers or laser diodes. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the imageable layer compositions are sensitive in the near-infrared or infrared region of the electromagnetic spectrum. However, other useful radiation-sensitive compositions are designed for imaging with ultraviolet or visible radiation.

There are two possible ways of using imageable layer compositions for the preparation of printing plates. For negative-working printing plates, exposed regions in the imageable layer are hardened and non-exposed regions are washed off during development. For positive-working printing plates, the exposed regions are dissolved in a developer and the non-exposed regions become an image.

Independently of the type of imageable element, lithography has generally been carried out using a metal substrate (or "support") such as a substrate comprising aluminum or an aluminum alloy of various metallic compositions. The surface of the metal sheet is generally roughened by surface graining in order to ensure good adhesion to a layer, usually an imageable layer, that is disposed thereon and to improve water retention in non-imaged regions during printing. Such aluminum-supported imageable elements are sometimes known in the art as precursors to planographic printing plates or lithographic printing plates.

To prepare aluminum-containing substrates for lithographic elements, a continuous web of raw aluminum can be treated, for example, using the sequence of steps that includes some type of graining, anodization using a suitable acid to provide an anodic oxide coating, and a post-treatment section that applies a hydrophilic coating before the web is rewound or passed on to coating stations for application of imageable layer formulations.

In the anodization section, the aluminum web is treated to form an aluminum oxide layer on its surface so it will exhibit a high degree of mechanical abrasion resistance necessary during the printing process. This oxide layer is already hydrophilic to some degree, which is significant for having a high affinity for water and for repelling printing ink. However, the oxide layer is so reactive that is can interact with components of the imageable layer in the imageable element. The oxide layer may partially or completely cover the aluminum substrate surface.

In the post-treatment section, the oxide layer is covered with a hydrophilic protective layer (also known in the art as a "seal", "sublayer", or "interlayer") to increase its hydrophilicity before one or more imageable layer formulations are applied. A suitable interlayer may also ensure that during development, the soluble regions of the imageable layer are easily removed from the substrate, leaving no residue and providing clean hydrophilic backgrounds. The hydrophilic interlayer can also protect the aluminum oxide layer against corrosion during development with highly alkaline developers and from dye penetration from the imageable layer.

A variety of substances have been described for this purpose including a silicate, dextrin, calcium zirconium fluoride, hexafluorosilicic acid, and polymers having functional groups such as carboxy, sulfonic acid, phosphonic acid, mercapto, hydroxyl, or amine groups. Specific hydrophilic protective layers are prepared from formulations including poly (vinyl phosphonic acid) (PVPA), vinyl phosphonic acid/acrylic acid (VPA/AA) copolymers, and poly(acrylic acid) (PAA).

Alternatively, the grained and anodized aluminum can also be treated with a phosphate solution that may further contain an inorganic fluoride (PF).

Various aqueous alkaline compositions (developers) are known for processing imaged negative-working and positive-working elements to provide lithographic printing plates. For example, high pH developers containing 5-30% alkali and 0.1-10% of an ethylene oxide/propylene oxide block copolymer are described in U.S. Pat. No. 4,945,030 (Turner et al.), and other developers containing a thickener such as glycerin and a $SiO_2$ to $M_2O$ weight ratio of at least 0.3 are described in U.S. Pat. No. 5,851,735 (Miller et al.).

High pH developers may also include various surfactants, anti-foaming agents, suspension agents including alkyleneoxide compounds and sugars as described for example in U.S. Pat. Nos. 5,670,294 (Piro) and 7,147,995 (Takamiya).

During use, the volume and activity of developers are diminished. The processing elements carry out measurable volumes of the developer from the developing apparatus, and the activity of the developer diminishes as it acts on the imaged elements.

Replenishers are often used to replace lost developer volume but these solutions generally have about the same composition and activity as the developers. They usually do not "replace" or restore developer activity. Regenerators are usually used for that purpose. They are designed with a specific combination of chemicals to replace both volume and activity in the "seasoned" developer.

Problem to be Solved

While it is usually desired to treat the grained and anodized with a post-treatment solution, use of the inorganic fluoride ("PF") treatment can be troublesome because it may require special effort to maintain clean treatment tanks and equipment, and to prevent damage (for example, pits, digs, or scratches) of the substrate. Treatment with hydrophilic materials such as poly(vinyl phosphonic acid), poly(vinyl pyrrolidones), gum Arabic, polysaccharides, and cellulosic materials, is less troublesome during manufacture, but the treated substrate is more easily etched during processing with developers having a pH of at least 12. This etching causes aluminum silicates (sludge) to build up in the processors. If it is not removed regularly, sludge can move throughout the processing apparatus, blocking plumbing, plugging spray bars, and destroying pumps. Etching will also create particles that re-deposit onto the developed element that may interfere with the printing operation.

While regenerators are known for replacing developer volume and restoring developer activity, it is not an easy matter to design a regenerator for a specific developer that will both restore developer activity sufficiently for processing and reduce etching of the aluminum substrates as described above.

Thus, there is a need to provide a processing means for imageable elements having aluminum substrates that reduce manufacturing problems. There is further a need for a method of using a combination of developing and regenerator compositions that are less likely to cause etching of the aluminum substrate and that can be used to efficiently provide lithographic printing plates from such imageable elements that provide long processing cycle time.

SUMMARY OF THE INVENTION

The present invention provides an advance in the art with a method of providing a lithographic printing plate comprising:

developing an imagewise exposed imageable element comprising a hydrophilic substrate with an alkali silicate-containing developer composition having a pH of at least 12, wherein the developer composition is regenerated by adding to it an alkali silicate-containing regenerator composition having a pH of at least 12, provided that the suppression of the conductivity of the developer composition, resulting from the presence of one or more conductivity reducing agents in the developer composition, is greater than the suppression of the conductivity of the regenerator composition.

In some embodiments, this invention comprises a method of providing a lithographic printing plate comprising:

developing an imagewise exposed positive-working imageable element comprising a hydrophilic substrate with an alkali silicate-containing developer composition having a pH of from about 12.0 to about 13.5, wherein the developer composition is regenerated by adding to it an alkali silicate-containing regenerator composition having a pH of from about 12.0 to about 13.5, provided that both developer and regenerator compositions contain glycerin, but the weight ratio of glycerin in the regenerator composition to that in the developer composition is less than 0.95:1 so that the conductivity of the developer composition is less than the conductivity of the regenerator composition.

Still further, the present invention provides a method of providing a lithographic printing plate comprising:

developing an imagewise exposed imageable element comprising a hydrophilic substrate with the developer composition having a pH of at least 12 and comprising:

A-D) an alkali silicate or metasilicate, or both,
B-D) an alkyl sulfate, and
C-D) a conductivity reducing agent, wherein the developer composition is regenerated by adding to it a regenerator composition having a pH of at least 12 and comprising:

A-R) an alkali silicate or metasilicate, or both,
B-R) an alkyl sulfate, and
C-R) a conductivity reducing agent, wherein the conductivity reducing agent of C-D provides a greater reduction of conductivity in the developer composition than the conductivity reducing agent of C-R provides for the regenerator composition.

A method of providing a lithographic printing plate comprises:

A) imagewise exposing a positive-working imageable element at an exposure energy of less than 100 mJ/cm$^2$, the element comprising an aluminum substrate that has been coated with a poly(vinyl phosphonic acid) and having disposed over the poly(vinyl phosphonic acid) coating, an infrared-radiation-sensitive imageable layer, B) with or without a post-exposure baking step, developing the imagewise exposed imageable element with a silicate-containing developer composition comprising glycerin and having a pH of from about 12.5 to about 13.5 and a conductivity of from about 40 to about 80 mS/cm, and C) adding to the developer composition a regenerator composition comprising glycerin, provided that the conductivity of the regenerator composition is higher by at least 1 mS/cm than the conductivity of the developer composition.

The present invention provides a method for restoring developer activity by adding a regenerator that has a higher conductivity than the developer. This can be achieved by suppressing or reducing the conductivity of the developer more than the conductivity in the regenerator is suppressed or reduced, using conductivity reducing agents described below.

The effect of the higher conductivity of the regenerator composition compared to the developer composition effectively restores developer activity, but the design of both compositions allows the user to effectively process various imaged elements, especially positive-working imaged elements (including elements that comprise an alkaline solution removable inner layer and an ink-receptive outer layer) with reduced etching of the aluminum-containing substrate and thereby avoiding the various problems described above. This benefit was unexpected because the pH and compositions of the regenerator and developer compositions are otherwise essentially the same.

In addition, the method of this invention provides long processing cycles with stable dot sizes throughout and with reduced sludging.

DETAILED DESCRIPTION OF THE INVENTION

Definitions

In addition, unless the context indicates otherwise, the various components described herein such as "silicate", "alkali silicate", "metal silicate", "metasilicate", "alkyl sulfate", "water-soluble or water-dispersible polyhydroxy compound", "aromatic sulfonate", "alkylaminopoly(alkyleneoxy)alcohol", and similar terms also refer to mixtures of such components. Thus, the use of the articles "a", "an", and "the" is not necessarily meant to refer to only a single component.

The term "single-layer imageable element" refers to an imageable element having only one imageable layer that is essential to imaging, but as pointed out in more detail below, such elements may also include one or more layers under or over (such as a overcoat or topcoat) the imageable layer to provide various properties.

The term "multilayer imageable element" refers to an imageable element having at least two imageable layers that are essential to imaging, but such elements can also include other optional layers for various purposes other than imaging.

Unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

The term "polymer" refers to high and low molecular weight polymers including oligomers and includes homopolymers and copolymers.

The term "copolymer" refers to polymers that are derived from two or more different monomers.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

By "silicate" we mean $SiO_2$ and by "alkali silicate" or "metal silicate", we mean $M_2SiO_3$ wherein M is an alkali metal such as sodium or potassium.

When used in reference to the alkali silicate-containing developer and regenerator compositions, "conductivity" is measured in milliSiemens/cm (mS/cm) using a conventional conductivity meter.

In reference to the alkali silicate-containing developer composition, the term "replenisher" refers to a composition that has essentially the same composition and pH as the developer composition being using during processing, that is added as needed to replace water volume and components that are lost during processing. In many instances, the developer composition is used as its own replenisher. While the replenisher can increase activity in a "seasoned" or depleted developer, it does not increase the activity greater than the "fresh" unused developer composition. Unless otherwise noted, the terms "alkali silicate-containing developer composition" and "developer composition" refer to the same composition.

The term "alkali silicate-containing regenerator" refers to a composition that has greater activity than a "fresh" unused developer composition and it used to maintain both volume and activity of the original developer composition. Unless otherwise noted, the terms "alkali silicate-containing regenerator composition" and "regenerator composition" refer to the same composition.

Developer and Regenerator Compositions

The alkali silicate-containing developer composition useful in the practice of this invention can be used in a processing method for developing imaged positive-working or negative-working lithographic printing plate precursors (or imageable elements) that are described in more detail below. It can be used as its own replenisher, thus eliminating the need for specially formulated replenishers. However, its can be "regenerated" using the regenerator composition described below to restore its activity as needed.

The developer composition generally has a conductivity of less than 80 mS/cm, and typically from about 40 to about 80 mS/cm, or from about 45 to about 65 mS/cm.

The developer composition generally has an alkaline pH of at least 12 and up to 14 and typically at least 12.0 and from about 12.5 to about 13.5. In addition to the alkali silicate(s) used to provide desired silicate concentration, alkalinity can also be provided using a suitable amount of one or more suitable chemical bases such as hydroxides (for example, ammonium hydroxide, sodium hydroxide, lithium hydroxide, and potassium hydroxide).

The silicate ($SiO_2$) concentration in the developer composition is at least 1.2 but no more than 3.5 weight % and typically from about 1.5 to about 3. Generally, silicate is provided in the form of a metal silicate or metasilicate (or both) such as ammonium silicate and alkali metal silicates (for example, lithium, sodium, and potassium silicates) and alkali metal metasilicates (for example, sodium metasilicate and potassium metasilicate). A mixture of metal silicates can be used if desired. Generally, the weight ratio of $SiO_2$ to $M_2O$ is at least 0.3 wherein "M" is an alkali metal (such as sodium or potassium). This weight ratio can be from about 0.3 and up to 1.3 with a ratio of from about 0.7 to about 1.1 being typical. A particularly useful weight ratio is from 0.95 to 1.05 (±0.002). Silicates and metasilicates can be obtained from a number of commercial sources.

The developer composition includes one or more conductivity reducing agents. Such agents can be identified by measuring the conductivity of the developer composition containing the conductivity reducing agents and comparing it to the conductivity of the same composition but with such agents omitted. These conductivity measurements (mS/cm) are generally carried out at 22° C. using a conventional conductivity meter.

Some useful conductivity reducing agents include water-soluble or water-dispersible polyhydroxy compounds such as glycerin (or glycerol), ethylene glycol, polyethylene glycol, polypropylene glycol, dipropylene glycol, trimethylol propane, and other compounds having a plurality of hydroxyl groups. Mixtures of these compounds can be used. Certain of these compounds may be optimal for different imaged elements, but glycerin has been found particularly useful for reducing the conductivity. The useful amount of the polyhydroxy compound can be at least 0.2 weight % and typically from about 2 to about 10 weight % or from about 6 to about 8 weight %, particularly when glycerin is used.

The developer composition can also include one or more salts of sulfate esters such as metal alkyl sulfates such as alkali metal or ammonium alkyl sulfates. Such compounds generally have alkyl groups having 6 to about 24 carbon atoms and typically from 8 to 16 carbon atoms. For example, alkali metal octyl sulfates are useful. Other useful metal alkyl sulfates include but are not limited to, sodium lauryl sulfate, ammonium octyl sulfate, ammonium lauryl sulfate, sodium dodecyl sulfate, sodium ethyl hexyl sulfate, and alkali metal sulfates derived from mixed long-chain alcohols. These salts are present in a total amount of at least 0.5 weight % and typically from about 0.5 to about 5 weight %. One commercial source of a sodium octyl sulfate is Texapon® 842 (Cognis Care Chemicals).

The developer composition can optionally also include an aromatic sulfonate in an amount of at least 0.5 weight %, and typically from about 0.5 to about 10 weight %. Representative aromatic sulfonates include but are not limited to, benzene sulfonates (such as sodium xylene sulfonate, sodium toluene sulfonate, and sodium cumene sulfonate), naphthalene sulfonates (such as sodium methyl naphthalene sulfonate, sodium butyl naphthalene sulfonate, sodium isopropyl naphthalene, and sodium diisopropyl naphthalene sulfonate). One commercial source of sodium naphthalene sulfonate is Petro AA (Akzo Nobel Ind. Specialists, Houston, Tex.).

The developer composition can further optionally include at least 0.01 weight % and typically from about 0.01 to about 0.2 weight % of an alkylaminopoly(alkyleneoxy)alcohol such as alkylaminopoly(ethyleneoxy)-polypropoxypropanol. One commercial source of alkylaminopoly(ethyleneoxy)-polypropoxypropanol is Triton® CF-32 (Dow Surfactants, Midland, Mich.).

Sequestering agents or chelating agents, such as aminopolycarboxylic acids and polyaminopolycarboxylic acids (or their salts) can also optionally be present in the developing composition. Examples of compounds of this type are alkylenediamine polyacetic acids including but not limited to 1,3-diamino-2-propanol-N,N,N',N'-tetraacetic acid (or alkali metal salts thereof), also known in the art as "EDTA", diethylenetriaminepentaacetic acid, triethylenetetraaminehexaacetic acid, hydroxyethylethylenediaminetriaacetic acid, nitrolotriacetic acid, and sodium and potassium salts thereof. These sequestering agents are present in an amount of at least 0.01 weight % and typically from about 0.01 to about 0.5 weight %. Examples of useful sequestering agents are described for example in EP 286,874A2 (Marchesano et al.).

Other optional components of the developing composition include but are not limited to, biocides (antifungal or antimicrobial agents), water-miscible organic solvents (such as alcohols), chelating agents other than those described above (such as alkali gluconates and organophosphonates), hydroquinone, an inorganic reducing agent such as a sulfite or bisulfite, water softening, and other surfactants (anionic, nonionic, or amphoteric) not described above. Further details about optional components of the developer composition are provided in EP 0 323 836B1 (Toyama) and U.S. Pat. No. 4,945,030 (Turner et al.).

The developer composition generally has a "cleanout speed" of less than 100 mJ/cm$^2$ and typically from about 50 to about 90 mJ/cm$^2$. This "cleanout speed" is the minimum energy (mJ/cm$^2$) required to produce a clean background on a printing plate after development of the imaged element with the developer composition for 22 seconds at 21° C. in a tray process. In this tray process, about 500 g of developer composition are poured into a 10 in×12 in (254 cm×305 cm) tray and the imaged element is immersed in the developer. After 22 seconds, the element is removed and immediately rinsed with water and dried. Densities of the imaged step wedge reproduced from an exposure series are measured with a conventional densitometer, or examined visually to determine the first step in which the image was completely removed. A lower cleanout speed value is indicative that less energy is required for imaging with the developer composition of this invention to provide a clean non-image (that is, clean removal of the exposed regions). This test is generally performed on a positive-working, single-layer imaged imageable element in which the imageable layer (1.5-2 g/m$^2$ dry coating weight) includes a phenolic resin as the predominant polymeric binder and an infrared radiation absorbing compound. For example, "cleanout speed" can be determined by imaging a KODAK ELECTRA Excel Thermal Plate (available from Eastman Kodak Company, Leeds, UK or Osterode, Del.) that has the construction described for example in Example 1 of U.S. Pat. No. 6,706,466 (Parsons et al.).

The alkali silicate-containing regenerator composition used in the practice of this invention generally has a conductivity of less than 100 mS/cm, and typically from about 41 to about 90 mS/cm, or from about 50 to about 70 mS/cm, as long at the regenerator composition conductivity is higher than the developer composition conductivity by at least 1 mS/cm and typically by at least 3 mS/cm. In general, the conductivity of the developer composition is suppressed or reduced to no more than 50% of the conductivity of the regenerator composition. This can be achieved by using one or more conductivity reducing agents described below (such as glycerin) in which the weight ratio of the conductivity suppressing agent(s) in the regenerator composition to the weight ratio of the same or different conductivity suppressing agent(s) in the developer composition is less than 0.95:1 and typically less than 0.5:1.

The difference in conductivity between the developer and regenerator compositions can be achieved by using different conductivity reducing agents in the compositions or by using different amounts of the same conductivity reducing agents in the compositions, or by using a combination of different amounts and types of conductivity reducing agents.

The regenerator composition generally has an alkaline pH of at least 12 and up to 14 and typically at least 12.0 and from about 12.5 to about 13.5. In addition to the alkali silicate(s) used to provide desired silicate concentration, alkalinity can also be provided using a suitable amount of one or more suitable chemical bases such as hydroxides (for example, ammonium hydroxide, sodium hydroxide, lithium hydroxide, and potassium hydroxide). The regenerator and developer compositions can be the same or different but typically they each have a pH of about 13.2.

The silicate (SiO$_2$) concentration in the regenerator composition is at least 1.2 but no more than 3.5 weight % and typically from about 1.5 to about 3. Generally, silicate is provided in the form of a metal silicate or metasilicate (or both) such as ammonium silicate and alkali metal silicates (for example, lithium, sodium, and potassium silicates) and alkali metal metasilicates (for example, sodium metasilicate and potassium metasilicate). A mixture of metal silicates can be used if desired. Generally, the weight ratio of SiO$_2$ to M$_2$O is at least 0.3 wherein "M" is an alkali metal (such as sodium or potassium). This weight ratio can be from about 0.3 and up to 1.3 with a ratio of from about 0.7 to about 1.1 being typical. A particularly useful weight ratio is from 0.95 to 1.05 (±0.002). Silicates and metasilicates can be obtained from a number of commercial sources.

The ratio of alkali silicate in the regenerator composition to the alkali silicate (same or different) in the developer composition is 1:1 or less and typically from about 0.8:1 to about 1:1.

As noted above, the regenerator composition also includes one or more conductivity reducing agents. Such agents can be identified by measuring the conductivity of the regenerator composition containing the conductivity reducing agents and comparing it to the conductivity of the same composition but with such agents omitted. These conductivity measurements (mS/cm) are generally carried out at 22° C. using a conventional conductivity meter.

Some useful conductivity reducing agents include water-soluble or water-dispersible polyhydroxy compounds such as glycerin (or glycerol), ethylene glycol, polyethylene glycol, polypropylene glycol, dipropylene glycol, trimethylol propane, and other compounds having a plurality of hydroxyl groups. Mixtures of these compounds can be used. Certain of these compounds may be optimal for different imaged elements, but glycerin has been found particularly useful for reducing the conductivity. The useful amount of the polyhydroxy compound can be at least 0.2 weight % and typically from about 2 to about 10 weight % or from about 6 to about 8 weight %, particularly when glycerin is used. The conductivity reducing agents can be the same or different in the developer and regenerator compositions, and typically they are the same (such as glycerin), and they can be present in the same or different amounts.

The regenerator composition can also include one or more salts of sulfate esters such as metal alkyl sulfates including alkali metal or ammonium alkyl sulfates. Such compounds generally have alkyl groups having 6 to about 24 carbon atoms and typically from 8 to 16 carbon atoms. For example, alkali metal octyl sulfates are useful. Other useful metal alkyl sulfates include but are not limited to, sodium lauryl sulfate, ammonium octyl sulfate, ammonium lauryl sulfate, sodium dodecyl sulfate, sodium ethyl hexyl sulfate, and alkali metal sulfates derived from mixed long-chain alcohols. These salts are present in a total amount of at least 0.5 weight % and typically from about 0.5 to about 5 weight %. One commercial source of sodium octyl sulfate is Texapon® 842 (Cognis Care Chemicals). The weight ratio of alkali metal alkyl sulfate(s) in the regenerator composition to the one or more alkali metal alkyl sulfate(s) in the developer composition is less than 5:1 and typically from about 0.5:1 to about 2:1. These sulfates can be the same or different in the developer and regenerator compositions.

The regenerator composition can optionally also include an aromatic sulfonate in an amount of at least 0.5 weight %, and typically from about 0.5 to about 10 weight %. Representative aromatic sulfonates include but are not limited to, benzene sulfonates (such as sodium xylene sulfonate, sodium toluene sulfonate, and sodium cumene sulfonate), naphthalene sulfonates (such as sodium methyl naphthalene sulfonate, sodium butyl naphthalene sulfonate, sodium isopropyl naphthalene, and sodium diisopropyl naphthalene sulfonate). One commercial source of sodium naphthalene sulfonate is Petro AA (Akzo Nobel Ind. Specialists, Houston, Tex.). The aromatic sulfonate(s) present in the regenerator and developer compositions can be the same or different compounds.

The regenerator composition can further optionally include at least 0.01 weight % and typically from about 0.01 to about 0.2 weight % of an alkylaminopoly(alkyleneoxy) alcohol such as alkylaminopoly(ethyleneoxy)-polypropoxypropanol. One commercial source of alkylaminopoly (ethyleneoxy)-polypropoxypropanol is Triton® CF-32 (Dow Surfactants, Midland, Mich.). These compounds can be the same or different in the regenerator and developer compositions.

Sequestering agents or chelating agents, such as aminopolycarboxylic acids and polyaminopolycarboxylic acids (or their salts) can also optionally be present in the developing composition. Examples of compounds of this type are alkylenediamine polyacetic acids including but not limited to 1,3-diamino-2-propanol-N,N,N',N'-tetraacetic acid (or alkali metal salts thereof), also known in the art as "EDTA", diethylenetriaminepentaacetic acid, triethylenetetraaminehexaacetic acid, hydroxyethylethylenediaminetriaacetic acid, nitrolotriacetic acid, and sodium and potassium salts thereof. These sequestering agents are present in an amount of at least 0.01 weight % and typically from about 0.01 to about 0.5 weight %. Examples of useful sequestering agents are described for example in EP 286,874A2 (Marchesano et al.). The sequestering agents can be the same or different for the developer and regenerator compositions.

Other optional components of the regenerator composition include but are not limited to, biocides (antifungal or antimicrobial agents), water-miscible organic solvents (such as alcohols), chelating agents other than those described above (such as alkali gluconates and organophosphonates), hydroquinone, an inorganic reducing agent such as a sulfite or bisulfite, water softening, and other surfactants (anionic, nonionic, or amphoteric) not described above. Further details about optional components are provided in EP 0 323 836B1 and U.S. Pat. No. 4,945,030 (both noted above). The regenerator and developer compositions can have the same or different optional components.

As noted above, the developer composition has a pH of at least 12 and comprises:
A-D) an alkali silicate or metasilicate, or both,
B-D) an alkyl sulfate, and
C-D) a conductivity reducing agent, and the regenerator composition has a pH of at least 12 and comprises:
A-R) an alkali silicate or metasilicate, or both,
B-R) an alkyl sulfate, and
C-R) a conductivity reducing agent, wherein the conductivity reducing agent of C-D provides a greater reduction of conductivity in the developer composition than the conductivity reducing agent of C-R provides for the regenerator composition.

In some embodiments, the conductivity reducing agents C-D and C-R are the same water-soluble or water-dispersible polyhydroxy compound (such as glycerin).

In some embodiments, the developer composition further comprises one, two, or all three of:
D-D) an aromatic sulfonate,
E-D) an alkylaminopoly(alkyleneoxy)alcohol,
F-D) an alkylenediamine polyacetic acid sequestering agent, and the regenerator composition further comprises one, two, or all three of:
D-R) an aromatic sulfonate,
E-R) an alkylaminopoly(alkyleneoxy)alcohol,
F-R) an alkylenediamine polyacetic acid sequestering agent, wherein the concentrations of D-R, E-R, and F-R are greater than 50% and less than 200% as the concentrations of D-D, E-D, and F-D, respectively.

Moreover, each of the developer composition and said regenerator composition has the same or different pH of from about 12.5 to about 13.5 and a different conductivity of from about 45 to about 90 mS/cm, wherein the conductivity of the regenerator composition is greater than the conductivity of the developer composition by at least 1 mS/cm.

The various components described above for the developer and regenerator compositions can be readily obtained from a number of commercial sources.

Imageable Elements

While the developer and regenerator compositions can be used to develop any imaged imageable element, generally they are used to process an imaged positive-working imageable element. Some embodiments of such imageable elements comprise an alkaline solution removable inner layer and an ink-receptive outer layer. In other embodiments, the imageable elements include only a single imageable layer that is removable in an alkaline solution. The imageable layer(s), which are composed of water- or alkaline solution-soluble polymeric compositions, are generally disposed on an aluminum-containing substrate. More details of such elements are provided as follows.

The substrates are generally provided initially as an electrochemically grained support having aluminum as the predominant component, and including supports of pure aluminum and aluminum alloys. Thus, the electrochemically grained metal support can be composed of pure aluminum, aluminum alloys having small amounts (up to 10% by weight) of other elements such as manganese, silicon, iron, titanium, copper, magnesium, chromium, zinc, bismuth, nickel, or zirconium, or be polymeric films or papers on which a pure aluminum or aluminum alloy sheet is laminated or deposited (for example, a laminate of an aluminum sheet and a polyester film).

The thickness of the resulting aluminum-containing substrate can be varied but should be sufficient to sustain the wear from printing and thin enough to wrap around a printing form. Generally, support sheets have a thickness of from about 100 to about 700 µm.

The substrates can be prepared as continuous webs or coiled strips to provide substrates as continuous webs that can be cut into desired sheets at a later time.

The aluminum surface of the support is generally cleaned, roughened, and anodized using suitable known procedures. For example, the surface may be roughened (or grained) by known techniques, such as mechanical roughening, electrochemical roughening, or a combination thereof (multi-graining). Electrochemically graining can be carried out in a suitable manner as described for example in U.S. Pat. No. 7,049,048 (noted above) that is incorporated herein for the graining procedures. In some embodiments, the surface of the aluminum-containing support can be electrochemically grained using the procedure and chemistry described in copending and commonly assigned U.S. Ser. No. 11/478,266 (filed Jun. 29, 2006 by Hunter, Hunter, Motoc, Doescher, Sroka, Huang, and Blum) that is also incorporated herein.

While this electrochemically grained metal sheet can now be used as a substrate, it is usually subjected to additional treatments before such use. Generally, the electrochemically grained metal surface is etched with an alkaline solution to remove at least 100 mg/m$^2$, and typically to remove from about 100 to about 1000 mg/m$^2$. The electrochemically grained aluminum support can then be anodized in a direct current passing through a sulfuric acid solution (5-30%) to form an oxide layer on the metal surface. When phosphoric acid is used for anodization, the conditions may be varied, as one skilled in the art would readily know.

The aluminum-containing support is then usually treated to provide a hydrophilic interlayer to render its surface more hydrophilic with, for example, a post-treatment solution containing a water- or alkali-soluble polymeric composition that can include a homopolymer of vinyl phosphonic acid (PVPA) or a vinyl phosphonic acid copolymer such as a copolymer derived from vinyl phosphonic acid and (meth)acrylic acid (that is either methacrylic acid, acrylic acid, or both). Typically, the electrochemically grained, etched, and anodized aluminum support is treated with poly(vinyl phosphonic acid).

The backside (non-imaging side) of an aluminum substrate may be coated with antistatic agents and/or slipping layers or a matte layer to improve handling and "feel" of the imageable element.

The substrates can be used to prepare a wide variety of imageable elements including negative- and positive-working imageable elements that can be imaged and processed for use as lithographic printing plates. Such imageable elements are generally lithographic printing plate precursors and include one or more ink-receptive layers disposed on the substrate. That is, they include one or more imageable layers besides any layers generally used as subbing layers, adhesion layers, protective cover layers, or for other non-imaging purposes.

The imageable layers (hence elements) can be made sensitive to any suitable imaging radiation including UV, visible, and infrared radiation having a maximum exposure wavelength of from about 150 to about 1500 nm. The imageable elements can be designed for imaging on a variety of processing apparatus and for development off-press using the developer composition in conventional developing apparatus.

For example, there are numerous publications in the art relating to negative-working imageable compositions and elements that can be processed with the developer composition. Some of those useful compositions are photosensitive and based on the use of naphthoquinonediazides, diazo resins, photosensitive polymers.

Other useful negative-working compositions generally include a polymerizable component (such as a free-radically polymerizable monomer, oligomer, or polymer, or acid-crosslinked compound), an initiator composition (such as compounds that generate free radicals, or promote cationically or acid-catalyzed polymerization or crosslinking), appropriate sensitizers or radiation absorbing compounds for a specific radiation sensitivity (also known as photothermal conversion materials) such as carbon blacks, IR dyes, coumarins, onium salts, triazines, metallocenes, polycarboxylic acids, hexaaryl bisimidazoles, and borate salts. Of these compositions, the IR-sensitive compositions are preferred.

Some useful negative-working imageable compositions and elements with which the present invention can be used include but are not limited to, those described in EP Patent Publications 770,494A1 (Vermeersch et al.), 924,570A1 (Fujimaki et al.), 1,063,103A1 (Uesugi), EP 1,182,033A1 (Fujimako et al.), EP 1,342,568A1 (Vermeersch et al.), EP 1,449,650A1 (Goto), and EP 1,614,539A1 (Vermeersch et al.), U.S. Pat. Nos. 4,511,645 (Koike et al.), 6,027,857 (Teng), 6,309,792 (Hauck et al.), 6,569,603 (Furukawa et al.), 6,899,994 (Huang et al.), 7,045,271 (Tao et al.), and 7,049,046 (Tao et al.), and U.S. Patent Application Publications 2003/0064318 (Huang et al.), 2004/0265736 (Aoshima et al.), 2005/0266349 (Van Damme et al.), and 2006/0019200 (Vermeersch et al.). Other negative-working compositions and elements are described for example in Japanese Kokai 2000-187322 (Takasaki), 2001-330946 (Saito et al.), 2002-040631 (Sakurai et al.), 2002-341536 (Miyamoto et al.), and 2006-317716 (Hayashi).

The imageable elements processed with the developer and regenerator compositions can also be single- or multi-layer, thermally-sensitive, positive-working imageable elements that generally rely on a radiation absorbing compound dispersed within one or more polymeric binders that, upon suitable irradiation, are soluble, dispersible, or removable in alkaline developers, of which there are numerous examples in the art. Thus, the imageable layer, upon irradiation, undergoes a change in solubility properties with respect to the alkaline developer in its irradiated (exposed) regions.

For example, "single-layer" positive-working imageable elements are described for example, in WO 2004/081662 (Memetea et al.), U.S. Pat. Nos. 6,255,033 (Levanon et al.), 6,280,899 (Hoare et al.), 6,485,890 (Hoare et al.), 6,558,869 (Hearson et al.), 6,706,466 (Parsons et al.), and 6,541,181 (Levanon et al.), EP 1,627,732 (Hatanaka et al.), and U.S. Published Patent Applications 2005/0214677 (Nagashima), 2004/0013965 (Memetea et al.), 2005/0003296 (Memetea et al.), and 2005/0214678 (Nagashima).

Other imageable elements that comprise an aluminum-containing substrate (provided according to this invention), an inner layer (also known as an "underlayer"), and an ink-receptive outer layer (also known as a "top layer" or "topcoat") disposed over the inner layer. Before thermal imaging, the outer layer is generally not soluble, dispersible, or removable by the developer composition within the usual time allotted for development, but after thermal imaging, the imaged regions of the outer layer are more readily removable by or dissolvable in the developer composition. The inner layer is also generally removable by an alkaline solution (developer) composition. An infrared radiation absorbing compound (defined below) is also present in the imageable element, and is typically present in the inner layer but may optionally be in a separate layer between the inner and outer layers.

Thermally imageable, multi-layer elements are described, for example, in U.S. Pat. Nos. 6,294,311 (Shimazu et al.), 6,352,812 (Shimazu et al.), 6,593,055 (Shimazu et al.), 6,352,811 (Patel et al.), 6,358,669 (Savariar-Hauck et al.), and 6,528,228 (Savariar-Hauck et al.), U.S. Patent Application Publications 2004/0067432 A1 (Kitson et al.) and 2005/0037280 (Loccufier et al.).

The inner layer is disposed between the outer layer and the substrate. Typically, it is disposed directly on the substrate. The inner layer comprises a predominant first polymeric material that is removable by the developer composition and preferably soluble in the developer composition to reduce sludging. In addition, this first polymeric material is preferably insoluble in the solvent used to coat the outer layer so that the outer layer can be coated over the inner layer without dissolving the inner layer. This polymeric material is also identified herein as the "first polymeric binder" so as to distinguish it from the "second polymeric binder" described below for the outer layer. Mixtures of these first polymeric binders can be used if desired in the inner layer.

Useful first polymeric binders for the inner layer include but are not limited to, (meth)acrylonitrile polymers, (meth) acrylic resins comprising pendant carboxy groups, polyvinyl acetals, maleated wood rosins, styrene-maleic anhydride copolymers, (meth)acrylamide polymers such as polymers derived from N-alkoxyalkyl methacrylamide, polymers derived from an N-substituted cyclic imide, polymers having pendant urea or cyclic urea groups, and combinations thereof. First polymeric binders that provide resistance both to fountain solution and aggressive washes are disclosed in U.S. Pat. No. 6,294,311 (noted above).

Useful first polymeric binders include (meth)acrylonitrile polymers, and polymers derived from an N-substituted cyclic imide (especially N-phenylmaleimide), a (meth)acrylamide (especially methacrylamide), a monomer having a pendant urea or cyclic urea group, and a (meth)acrylic acid (especially methacrylic acid). First polymeric binders of this type are copolymers that comprise from about 20 to about 75 mol % of recurring units derived from N-phenylmaleimide, N-cyclohexylmaleimide, N-(4-carboxyphenyl)maleimide, N-benzylmaleimide, or a mixture thereof, from about 10 to about 50 mol % of recurring units derived from acrylamide, methacrylamide, or a mixture thereof, and from about 5 to about 30 mol % of recurring units derived from methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid. Optionally, these polymers can also include recurring units derived from (meth)acrylonitrile or N-[2-(2-oxo-1-imidazolidinyl)ethyl]-methacrylamide.

Other useful first polymeric binders can comprise, in polymerized form, from about 5 mol % to about 30 mol % of recurring units derived from an ethylenically unsaturated polymerizable monomer having a carboxy group (such as acrylic acid, methacrylic acid, itaconic acid, and other similar monomers known in the art (acrylic acid and methacrylic acid are preferred), from about 20 mol % to about 75 mol % of recurring units derived from N-phenylmaleimide, N-cyclohexylmaleimide, or a mixture thereof, optionally, from about 5 mol % to about 50 mol % of recurring units derived from methacrylamide, and from about 3 mol % to about 50 mol % of one or more recurring units derived from monomer compounds of the following Structure (I):

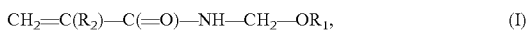

$$CH_2=C(R_2)-C(=O)-NH-CH_2-OR_1, \quad (I)$$

wherein $R_1$ is a $C_1$ to $C_{12}$ alkyl, phenyl, $C_1$ to $C_{12}$ substituted phenyl, $C_1$ to $C_{12}$ aralkyl, or $Si(CH_3)_3$, and $R_2$ is hydrogen or methyl. Methods of preparation of certain of these polymeric materials are disclosed in U.S. Pat. No. 6,475,692 (Jarek).

The first polymeric binder useful in this invention can also be hydroxy-containing polymeric material composed of recurring units derived from two or more ethylenically unsaturated monomers wherein from about 1 to about 50 mol % of the recurring units are derived from one or more of the monomers represented by the following Structure (II):

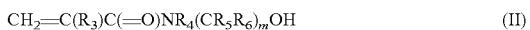

$$CH_2=C(R_3)C(=O)NR_4(CR_5R_6)_mOH \quad (II)$$

wherein $R_3$, $R_4$, $R_5$, $R_6$ are independently hydrogen, substituted or unsubstituted lower alkyl having 1 to 10 carbon atoms (such as methyl, chloromethyl, ethyl, iso-propyl, t-butyl, and n-decyl), or substituted or unsubstituted phenyl, and m is 1 to 20. Such first polymeric binders can include recurring units derived from one or both of N-hydroxymethylacrylamide and N-hydroxymethylmethacrylamide, recurring units derived from one or more of N-phenylmaleimide, N-cyclohexylmaleimide, N-benzylmaleimide, N-(4-carboxyphenyl)maleimide, (meth)acrylic acid, and vinyl benzoic acid, and recurring units derived from one or more of a styrenic monomer (such as styrene and derivatives thereof), meth(acrylate) ester, N-substituted (meth)acrylamide, maleic anhydride, (meth) acrylonitrile, allyl acrylate, and a compound represented by the following Structure (V):

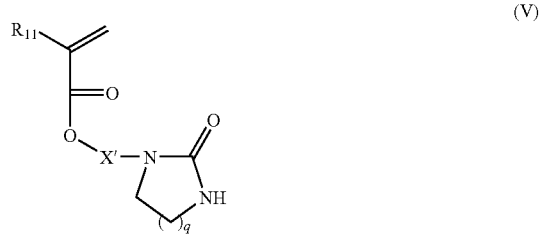

wherein $R_{11}$ is hydrogen, methyl, or halo, q is 1 to 3, and X' is alkylene having 2 to 12 carbon atoms.

Still other useful first polymeric binders are addition or condensation polymers that have a polymer backbone having attached pendant phosphoric acid groups, pendant adamantyl groups, or both types of pendant groups. The pendant adamantyl groups are connected to the polymer backbone from about through a urea or urethane linking group but other linking groups can also be present.

Other useful first polymeric binders comprise a backbone and have attached to the backbone the following Structure Q group:

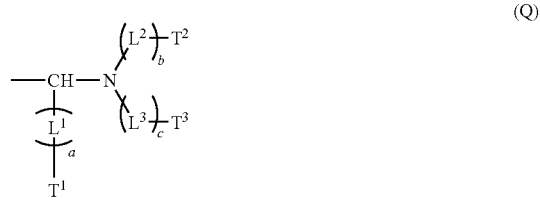

wherein $L^1$, $L^2$, and $L^3$ independently represent linking groups, $T^1$, $T^2$, and $T^3$ independently represent terminal groups, and a, b, and c are independently 0 or 1.

The first polymeric binders are the predominant polymeric materials in the inner layer. That is, they comprise from about 50% to about 100% (dry weight) of the total polymeric materials in the inner layer. However, the inner layer may also comprise one or more primary additional polymeric materials, provided these primary additional polymeric materials do not adversely affect the chemical resistance and solubility properties of the inner layer.

Useful primary additional polymeric materials include copolymers that comprises from about 1 to about 30 mole % of recurring units derived from N-phenylmaleimide, from about 1 to about 30 mole % of recurring units derived from methacrylamide, from about 20 to about 75 mole % of recurring units derived from acrylonitrile, and from about 20 to about 75 mole % of recurring units derived from one or more monomers of the Structure (IX):

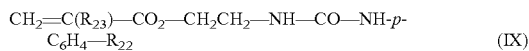

wherein $R_{22}$ is OH, COOH, or $SO_2NH_2$, and $R_{23}$ is H or methyl, and, optionally, from about 1 to about 30 mole % and, when present, from about 3 to about 20 mole % of recurring units derived from one or more monomers of the Structure (X):

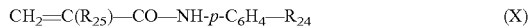

wherein $R_{24}$ is OH, COOH, or $SO_2NH_2$, and $R_{25}$ is H or methyl.

The inner layer may also comprise one or more secondary additional polymeric materials that are resins having activated methylol and/or activated alkylated methylol groups. These "secondary additional polymeric materials" in the inner layer should not be confused as the "second polymeric binder" used in the outer layer.

The secondary additional polymeric materials can include, for example resole resins and their alkylated analogs, methylol melamine resins and their alkylated analogs (for example melamine-formaldehyde resins), methylol glycoluril resins and alkylated analogs (for example, glycoluril-formaldehyde resins), thiourea-formaldehyde resins, guanamine-formaldehyde resins, and benzoguanamine-formaldehyde resins. Commercially available melamine-formaldehyde resins and glycoluril-formaldehyde resins include, for example, CYMEL® resins (Dyno Cyanamid) and NIKALAC® resins (Sanwa Chemical).

The resin having activated methylol and/or activated alkylated methylol groups is preferably a resole resin or a mixture of resole resins. Resole resins are well known to those skilled in the art. They are prepared by reaction of a phenol with an aldehyde under basic conditions using an excess of phenol. Commercially available resole resins include, for example, GP649D99 resole (Georgia Pacific) and BKS-5928 resole resin (Union Carbide).

Useful secondary additional polymeric materials can also include copolymers that comprise from about 25 to about 75 mole % of recurring units derived from N-phenylmaleimide, from about 10 to about 50 mole % of recurring units derived from methacrylamide, and from about 5 to about 30 mole % of recurring units derived from methacrylic acid. These secondary additional copolymers are disclosed in U.S. Pat. Nos. 6,294,311 (noted above) and 6,528,228 (noted above).

In some embodiments, the inner layer (and typically only the inner layer) further comprises an infrared radiation absorbing compound ("IR absorbing compounds") that absorbs radiation from about at 600 nm to about 1500 and typically from about at 700 nm to about 1200 nm, with minimal absorption at from about 300 to about 600 nm. This compound (sometimes known as a "photothermal conversion material") absorbs radiation and converts it to heat. Although one of the polymeric materials may itself comprise an IR absorbing moiety, typically the infrared radiation absorbing compound is a separate compound. This compound may be either a dye or pigments such as iron oxides and carbon blacks. Examples of useful pigments are ProJet 900, ProJet 860 and ProJet 830 (all available from the Zeneca Corporation).

Useful infrared radiation absorbing compounds also include carbon blacks including carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

IR absorbing dyes (especially those that are soluble in an alkaline developer) are desired to prevent sludging of the developer by insoluble material. Examples of suitable IR dyes include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indoaniline dyes, merostyryl dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in numerous publications including U.S. Pat. Nos. 6,294,311 (noted above) and 5,208,135 (Patel et al.) and the references cited thereon.

Examples of useful IR absorbing compounds include ADS-830A and ADS-1064 (American Dye Source, Baie D'Urfe, Quebec, Canada), EC2117 (FEW, Wolfen, Germany), Cyasorb® IR 99 and Cyasorb® IR 165 (GPTGlendale Inc. Lakeland, Fla.), and IR Absorbing Dye A used in the Examples below.

Near infrared absorbing cyanine dyes are also useful and are described for example in U.S. Pat. Nos. 6,309,792 (Hauck et al.), 6,264,920 (Achilefu et al.), 6,153,356 (Urano et al.), 5,496,903 (Watanate et al.). Suitable dyes may be formed using conventional methods and starting materials or obtained from various commercial sources including American Dye Source (Canada) and FEW Chemicals (Germany). Other useful dyes for near infrared diode laser beams are described, for example, in U.S. Pat. No. 4,973,572 (DeBoer).

In addition to low molecular weight IR-absorbing dyes, IR dye moieties bonded to polymers can be used as well. Moreover, IR dye cations can be used, that is, the cation is the IR absorbing portion of the dye salt that ionically interacts with a polymer comprising carboxy, sulfo, phosphor, or phosphono groups in the side chains.

The infrared radiation absorbing compound can be present in the imageable element in an amount of generally from about 5% to about 30% and typically from about 12 to about 25%, based on the total dry weight of the element. This amount is based on the total dry weight of the layer in which it is located.

The ink-receptive outer layer of the imageable element is disposed over the inner layer and in typical embodiments there are no intermediate layers between the inner and outer layers. The outer layer comprises a second polymeric material that is different than the first polymeric binder described above. The outer layer is substantially free of infrared radiation absorbing compounds, meaning that none of these compounds are purposely incorporated therein and insubstantial amounts diffuse into it from other layers.

Thus, the outer layer comprises a second polymeric binder that is a light-stable, water-insoluble, alkaline developer soluble, film-forming binder material such as phenolic resins, urethane resins, and polyacrylates. Particularly useful binder materials are described, for example in U.S. Pat. Nos. 6,352,812 (noted above), 6,358,669 (noted above), 6,352,811 (noted above), 6,294,311 (noted above), 6,893,783 (Kitson et al.), and 6,645,689 (Jarek), U.S. Patent Application Publications 2003/0108817 (Patel et al) and 2003/0162126 (Kitson et al.), and WO 2005/018934 (Kitson et al.).

Other useful film-forming second polymeric binders for the outer layer are phenolic resins or hydroxy-containing polymers containing phenolic monomeric units that can be random, alternating, block, or graft copolymers of different monomers and may be selected from polymers of vinyl phenol, novolak resins, or resole resins.

Useful poly(vinyl phenol) resins can be polymers of one or more hydroxyphenyl containing monomers such as hydroxystyrenes and hydroxyphenyl (meth)acrylates. Other monomers not containing hydroxy groups can be copolymerized with the hydroxy-containing monomers. These resins can be prepared by polymerizing one or more of the monomers in the presence of a radical initiator or a cationic polymerization initiator using known reaction conditions.

Examples of useful hydroxy-containing polymers include ALNOVOL SPN452, SPN400, HPN100 (Clariant GmbH), DURITE PD443, SD423A, SD126A, PD494A, PD-140 (Hexion Specialty Chemicals, Columbus, Ohio), BAKELITE 6866LB02, AG, 6866LB03 (Bakelite AG), KR 400/8 (Koyo Chemicals Inc.), HRJ 1085 and 2606 (Schenectady International, Inc.), and Lyncur CMM (Siber Hegner), all of which are described in U.S. Patent Application Publication 2005/0037280 (noted above).

Useful novolak resins in the upper layer can be non-functionalized, or functionalized with polar groups including but not limited to, diazo groups, carboxylic acid esters (such as acetate benzoate), phosphate esters, sulfinate esters, sulfonate esters (such as methyl sulfonate, phenyl sulfonate, tosylate, 2-nitrobenzene tosylate, and p-bromophenyl sulfonate), and ethers (such as phenyl ethers). The phenolic hydroxyl groups can be converted to -T-Z groups in which "T" is a polar group and "Z" is another non-diazide functional group (as described for example in WO 99/01795 of McCullough et al. and U.S. Pat. No. 6,218,083 of McCullough et al.). The phenolic hydroxyl groups can also be derivatized with diazo groups containing o-naphthoquinone diazide moieties (as described for example in U.S. Pat. Nos. 5,705,308 and 5,705,322 both of West et al.).

It is also possible to include in the outer layer one or more "modified" phenolic resin binders that comprise phenolic recurring units that are substituted by the group represented by Structure (Q) shown above for the polymeric binders useful in the inner layer. Thus, the inner and outer layers can comprise the same or different "modified" phenolic resin binder.

Other useful second polymeric binders include copolymers of maleic anhydride and styrene or a substituted styrene or a mixture of styrene monomers. The maleic anhydride generally comprises from about 1 to about 50 mol % of the copolymer. Additional monomers, such as (meth)acrylates, and (meth)acrylonitriles, (meth)acrylamides can also be used to provide recurring units within the copolymers.

Still other useful second polymeric binders include copolymers of one or more (meth)acrylates and one or more monomers containing a carboxy group and having 14 or less carbon atoms. Examples of useful (meth)acrylates include but are not limited to, methyl acrylate, methyl methacrylate, ethyl acrylate, ethyl methacrylate, n-butyl acrylate, and n-butyl methacrylate. Useful monomers having a carboxy group include but are not limited to, acrylic acid, methacrylic acid, 3-vinyl benzoic acid, 4-vinyl benzoic acid, itaconic acid, maleic acid, and monomers formed from the reaction of a hydroxyl-containing monomer (such as 2-hydroxyethyl acrylate and 2-hydroxyethyl methacrylate) and a cyclic anhydride (such as succinic anhydride or phthalic anhydride). The molar ratio of the (meth)acrylate monomer(s) to the carboxy-containing monomer(s) is generally from about 80:20 to about 98:2. Such copolymers can also include recurring units derived from one or more of maleic anhydride, vinyl ethers, (meth)acrylonitriles, and (meth)acrylamides.

Still more useful second polymeric binders are the copolymers described in U.S. Patent Application Publication 2004/0137366 (Kawauchi et al.) that comprise pendant carboxy groups directly or indirectly attached to the polymer backbone.

The second polymeric binder can also comprises recurring units having pendant carboxy groups that are generally represented by the following Structure (XI) or (XII), which recurring units comprise from about 3 mol % of the total recurring units in the second polymeric binder:

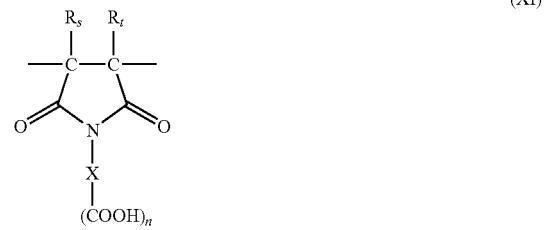

(XI)

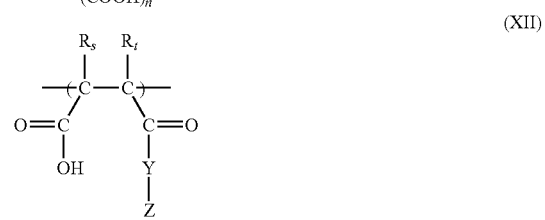

(XII)

wherein n is 1 to 3 (preferably 1 or 2 and more preferably 1).

In Structure (XI) or (XII), $R_s$, and $R_t$ are independently hydrogen or a substituted or unsubstituted alkyl group having 1 to 7 carbon atoms (such as methyl, ethyl, t-butyl, or benzyl), or a halo group (such as chloro or bromo). Preferably, $R_s$, and $R_t$ are independently hydrogen or a substituted or unsubstituted methyl group or chloro group, and more preferably, they are independently hydrogen or a methyl group.

X is a multivalent linking group including but not limited to multivalent aliphatic and aromatic linking groups, and combinations thereof. In most embodiments, X is a divalent linking group. Such groups can include alkylene, arylene, alkylenearylene, arylenealkylene, alkyleneoxyalkylene, aryleneoxyarylene, and alkyleneoxyarylene groups, all of which can be unsubstituted or substituted with one or more substituents that do not adversely affect the performance of the second polymeric binder. Preferably, X is a substituted or unsubstituted phenylene group, especially when n is 1.

In Structure (XII), Y is oxy or —NR— wherein R is hydrogen or a substituted or unsubstituted alkyl group having 1 to 10 carbon atoms (such as methyl, ethyl, iso-propyl, n-hexyl, and benzyl groups). Preferably Y is an oxy group.

Also in Structure (XII), Z is a monovalent organic group including but not limited to, a monovalent aliphatic or aromatic group, or a combination thereof. Such groups are defined similar to the multivalent groups described above for X but can also include arylene or alkylene groups, or combinations thereof, with or without carbonyl groups [C(=O)] or amido groups (—NH—) groups, or combinations thereof. For example, useful Z groups include —R'—NHC(=O)R" groups wherein R' is a substituted or unsubstituted alkylene group having 2 to 6 carbon atoms (such as ethylene and iso-propylene), and R" is a substituted or unsubstituted alkyl group having 1 to about 10 carbon atoms (such as methyl, methoxymethyl, ethyl, iso-propyl, n-hexyl, and benzyl groups). One particularly useful Z group is a —$CH_2CH_2$NHC (=O)-phenyl group.

Z can also be a substituted or unsubstituted alkyl group having 1 to 10 carbon atoms (such as methyl, ethyl, iso-propyl, t-butyl, n-hexyl, and benzyl groups). Particularly useful alkyl groups for Z include those having 1 to 8 carbon atoms (including straight-chain and branched butyl groups).

The second polymeric binders can be prepared using a variety of methods. For example, maleimide polymers with pendant carboxylic acid groups can be readily prepared by free radical polymerization of the maleimide monomers corresponding to the recurring units of Structure (XI) using a conventional radical initiator [such as 2,2'-azobis(iso-butyronitrile) or AIBN], or by imidization of the corresponding amine with the anhydride copolymer, in suitable solvents that are inert to the reactants. Polymers comprising Structure (XII) recurring units can be obtained by polymerization of maleic anhydride and the subsequent reaction with an alcohol or secondary amine. Polymers containing Structure (XII) recurring units are available as commercial products such as Scripset® 540 styrene-maleic anhydride copolymers (available from Hercules, Wilmington, Del.). The second polymeric binders can be homopolymers or copolymers.

Thus, useful polymeric binders in the outer layer include copolymers comprising recurring units derived from styrene or a styrene derivative and recurring units derived from maleic anhydride, copolymers comprising recurring units derived from a (meth)acrylate and recurring units derived from a (meth)acrylic acid, or mixtures of both types of copolymers. Further details of these types of copolymers are described in U.S. Patent Application Publication 2007/0065737 (Kitson et al.).

The second polymeric binder is generally present in the outer layer at a dry coverage of from about 1 to about 100 weight %, based on total dry weight of that layer.

The outer layer can also include non-phenolic polymeric materials as film-forming binder materials in addition to or instead of the phenolic resins described above. Such non-phenolic polymeric materials include polymers formed from maleic anhydride and one or more styrenic monomers (that is styrene and styrene derivatives having various substituents on the benzene ring), polymers formed from methyl methacrylate and one or more carboxy-containing monomers, and mixtures thereof. These polymers can comprises recurring units derived from the noted monomers as well as recurring units derived from additional, but optional monomers [such as (meth)acrylates, (meth)acrylonitriles and (meth)acrylamides].

In some embodiments, the outer layer may further include a monomeric or polymeric compound that includes a benzoquinone diazide and/or naphthoquinone diazide moiety. The polymeric compounds can be phenolic resins derivatized with a benzoquinone diazide and/or naphthoquinone diazide moiety as described for example in U.S. Pat. Nos. 5,705,308 (West et al.) and 5,705,322 (West et al.). Mixtures of such compounds can also be used. An example of a useful polymeric compound of this type is P-3000, a naphthoquinone diazide of a pyrogallol/acetone resin (available from PCAS, France). Other useful compounds containing diazide moieties are described for example in U.S. Pat. Nos. 6,294,311 (noted above) and 5,143,816 (Mizutani et al.).

The outer layer can optionally include additional compounds that are colorants that may function as solubility-suppressing components for the alkali-soluble polymers. These colorants typically have polar functional groups that are believed to act as acceptor sites for hydrogen bonding with various groups in the polymeric binders. Colorants that are soluble in the alkaline developer are preferred. Useful polar groups include but are not limited to, diazo groups, diazonium groups, keto groups, sulfonic acid ester groups, phosphate ester groups, triarylmethane groups, onium groups (such as sulfonium, iodonium, and phosphonium groups), groups in which a nitrogen atom is incorporated into a heterocyclic ring, and groups that contain a positively charged atom (such as quaternized ammonium group). Further details and representative colorants are described for example in U.S. Pat. No. 6,294,311 (noted above). Particularly useful colorants include triarylmethane dyes such as ethyl violet, crystal violet, malachite green, brilliant green, Victoria blue B, Victoria blue R, and Victoria pure blue BO. These compounds can act as contrast dyes.

Imaging and Development

During use, the imageable element is exposed to a suitable source of radiation, including UV, visible and infrared radiation using a suitable source. It is desired to irradiate using an infrared laser at a wavelength of from about 600 nm to about 1500 nm and typically at a wavelength of from about 700 nm to about 1200 nm. The lasers used to expose the imageable elements are typically diode lasers, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1040 to about 1120 nm.

The imaging apparatus can be configured as a flatbed recorder or as a drum recorder, with the imageable member mounted to the interior or exterior cylindrical surface of the drum. Examples of useful imaging apparatus are available as models of Creo Trendsetter® imagesetters available from Creo Corporation (a subsidiary of Eastman Kodak Company, Burnaby, British Columbia, Canada) that contain laser diodes that emit near infrared radiation at a wavelength of about 830 nm. Other suitable imaging sources include the Crescent 42T Platesetter that operates at a wavelength of 1064 nm and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio). Imaging is generally carried out by direct digital imaging (that is, "computer-to-plate" imaging).

The imaged element comprises a latent image of imaged (exposed) and non-imaged (non-exposed) regions.

For imaged positive-working imageable elements, development removes the exposed regions of one or more layers, for example, the outer layer and the underlying layers (including the inner layer), and exposes the hydrophilic surface of the substrate of this invention. The exposed (or imaged) regions of the hydrophilic surface of the substrate repel ink while the non-exposed (or non-imaged) regions of the outer layer accept ink.

Generally, development of the imaged element can be carried out by rubbing or wiping its outermost layer with an applicator containing the developer composition. Alternatively, the imaged element can be brushed with the developer composition, or the developer composition can be applied by spraying the imaged element with sufficient force to remove the exposed (imaged) regions. In still another alternative, the imaged element can be immersed in the developer composition.

Thus, the development process can be carried out using equipment having the appropriate arrangement of tanks, spray bars, plumbing, rollers, pumps, or applicators. Commercially available "spray on" processors include the 85 NS Processor (Eastman Kodak Company, Norwalk, Conn.). Commercially available "immersion" processors include the Mercury™ Mark V Processor (Eastman Kodak Company), the Global Graphics Titanium Processor (Global Graphics, Trenton, N.J.) and the Glunz and Jensen Quartz 85 Processor (Glunz and Jensen, Elkwood, Va.).

Generally, the imaged elements are developed using the developer composition of this invention at from about 19 to about 25° C. for from about 5 to about 60 seconds (residence time).

During development, the developer composition can be replenished with a developer replenisher that has substantially the same pH, chemical composition, and activity as the developer composition. In other words, the developer replenisher is not a regenerator that has a different chemical composition or activity as the developer composition. Replenishment can be carried out at any particularly useful rate, and either continuously or intermittently, using conventional conditions and equipment.

However, adding the regenerator composition described above to the developer composition, as needed advantageously carries out the present invention. This addition can be carried out in a continuous or intermittent manner as is well known in the art.

Generally, in practice, the regenerator composition is metered into the developer composition as needed, for example, as prompted by the number of imaged elements (or total area) being processed. The various pieces of equipment, sensors, and pumps that are used for this purpose would be readily apparent to a worker skilled in the art. For example, the commercial developing processor and printing plate manufacturers often publish standard operating procedures that provide instructions for adding regenerator compositions.

By way of example, the conditions for practicing the present invention using a commercially available Mercury Mark VI processor are generally as follows while processing at 23° C.:

Initial developer composition charge of 50 liters to the processor,

Processing at a speed of 1000 mm/min,

Addition of regenerator composition at 100 ml/m$^2$ of processed element, and

Addition of a regenerator antioxidant ("Anti-Ox") of about 75 ml/hr of processing.

Following development, the imaged element can be rinsed with water and dried in a suitable fashion. The dried element can also be treated with a conventional gumming solution (preferably a surfactant, starch, dextrin, or gum Arabic desensitizing solution).

The imaged and developed element can also be baked to increase run length of the resulting imaged element. Baking can be carried out, for example at a temperature of from about 220° C. to about 240° C. for a time of from about 7 to about 10 minutes, or at about 120° C. for 30 minutes.

A lithographic ink and fountain solution can be applied to the printing surface of the imaged element for printing. The oleophilic regions of the outer layer take up ink and the fountain solution is taken up by the hydrophilic surface (usually the aluminum-containing substrate of this invention) revealed by the imaging and development process. The ink is then transferred to a suitable receiving material (such as cloth, paper, metal, glass, or plastic) to provide a desired impression of the image thereon. An intermediate cylinder is often used to transfer the ink from the imaged member to the receiving material.

The following examples are presented to illustrate the practice of this invention and are not intended to be limiting in any way.

EXAMPLES

The components and materials used in the examples and analytical methods were as follows:

Fastusol Blue 79L was obtained from BASF Corporation (Florham Park, N.J.).

KODAK ELECTRA Thermal Plates are single-layer, positive-working printing plate precursors that are commercially available from Eastman Kodak Company. For example, KODAK ELECTRA Excel Thermal Plates and KODAK ELECTRA Excel HRL Thermal Plates are available from Eastman Kodak Company (Leeds, UK) and KODAK ELECTRA Excel HRO Thermal Plates are available from Eastman Kodak Company (Osterode, Germany).

METSO® PENTABEAD 20 is a source of sodium metasilicate (58.4%) and was obtained from PQ Corporation (Valley Forge, Pa.).

Petro AA contains sodium naphthalene sulfonate (51%) and was obtained from Schibley Chemicals (Elyria, Ohio).

Texapon® 842 contains sodium octyl sulfate (40.7%) and was obtained from Cognis Care Chemicals.

Triton® CF-32 contains alkylaminopolyethoxypolypropoxypropanol (95%) and was obtained from Dow Surfactants (Midland, Mich.).

The Etching Dip Test was carried out by removing the imageable layer coating from a commercially available KODAK ELECTRA Excel HRO Thermal Plate using methyl ethyl ketone, followed by drying. The remaining electrochemically grained, and sulfuric acid-anodized, poly(vinyl phosphonic acid)-coated, aluminum-containing substrate was then immersed in a beaker of developer composition at 21° C. and the time for active (rolling) bubble formation on the surface of the substrate was recorded.

The Foaming Test refers to the time required for the foam in the developer composition to dissipate. The time for foam to dissipate was determined by a foam shake test in a vial in which the time for the head of foam to disappear was observed.

Invention Example 1

A developer composition and regenerator composition useful in the practice of this invention were formulated with the components shown in TABLE I below.

TABLE I

| Components | Developer Composition (parts) | Regenerator Composition (parts) |
|---|---|---|
| Demineralized water | 771.58 | 807.58 |
| METSO ® PENTABEAD 20 (sodium metasilicate, 58.4% solids) | 67.10 | 67.10 |
| Triton ® CF-32 (95% solids) | 0.72 | 0.72 |
| Glycerin (99.5% solids) | 66.00 | 30.00 |
| Fastusol Blue 79L solution | 0 | 0.005 |
| Texapon ® 842 (40.7% solids) | 30.80 | 30.80 |
| Petro AA (51% solids) | 62.70 | 62.70 |
| Ethylenediaminetetraaminoacetic acid (EDTA), sodium salt (83.6% solids) | 1.10 | 1.10 |
| | 1000.00 | 1000.00 |
| Conductivity | 52.1 | 58.7 |
| PH | 13.2 | 13.3 |
| Specific gravity at 22° C. | 1.074 | 1.066 |
| Etching Dip Test | 7 minutes, 10 seconds | 4 minutes, 45 seconds |
| Foaming | 14 minutes | 12 minutes |

The results in Invention Example 1 indicate that both the developer composition and regenerator composition provided improved aluminum-containing substrate etch resistance as shown in the Etching Dip Test. The same test carried out using the commercially available GOLDSTAR™ PLUS and PREMIUM developers (Eastman Kodak Company, Norwalk, Conn.), showed Etching Dip Tests results of 25 seconds and 75 seconds, respectively.

Foaming was dissipated within a reasonable time for both the developer composition and regenerator composition shown in TABLE I.

Glycerin was used as the conductivity reducing agent in both the developer and regenerator compositions. The conductivity of the developer composition was reduced more than the conductivity of the regenerator composition from what they would have been with the omission of the glycerin.

Since the conductivity of the regenerator composition is greater than the conductivity of the developer composition, the addition of the regenerator composition to the developer composition maintains the activity of that composition. Since the regenerator composition does not contain higher levels of silicate or strong bases to maintain developer composition activity, the likelihood of etching of the aluminum substrate and resulting sludging are reduced. Moreover, the reduced substrate etching produces a uniformly hydrophilic non-image (non-exposed) surface without scratches, digs, pits, or corroded areas that might impair print quality during the press operation. Longer processor cycles are then possible with uniform dot distribution throughout.

Invention Example 2

The developer composition and regenerator composition described in Example 2 and three other regenerator compositions from which glycerin was omitted, were evaluated for several properties. The components of each composition are shown in TABLE II below.

TABLE II

| | Invention Developer Composition | Invention Regenerator Composition | Comparative Regenerator Composition A No Glycerin 100% silicate | Comparative Regenerator Composition B No Glycerin 95% Silicate | Comparative Regenerator Composition C No Glycerin 90% Silicate |
|---|---|---|---|---|---|
| Demineralized water | 771.580 | 807.58 | 837.58 | 840.93 | 844.28 |
| METSO ® 520 (sodium metasilicate, 58.4% solids) | 67.10 | 67.10 | 67.10 | 63.75 | 60.40 |
| Triton ® CF-32 (95% solids) | 0.72 | 0.72 | 0.72 | 0.72 | 0.72 |
| Glycerin (99.5% solids) | 66.00 | 30.00 | 0 | 0 | 0 |
| Texapon ® 842 (40.7% solids) | 30.80 | 30.80 | 30.80 | 30.80 | 30.80 |
| Petro AA (51% solids) | 62.70 | 62.70 | 62.70 | 62.70 | 62.70 |
| EDTA Tetra Sodium Salt (83.6% solids) | 1.10 | 1.10 | 1.10 | 1.10 | 1.10 |
| Fastusol Blue 79L | 0 | 0.005 | 0.005 | 0.005 | 0.005 |
| | 1000.00 | 1000.00 | 1000.00 | 1000.00 | 1000.00 |
| Conductivity - Meter 10 | 52.6 | 58.7 | 64.5 | 62.6 | 60.6 |
| pH - Meter 10 | 13.5 | 13.5 | 13.6 | 13.3 | 13.2 |
| Etching Dip Test | | | | | |
| Foaming Test | | | | | |
| Speed (mJ/cm$^2$) | 65 | 60 | 50 | 52 | 60 |

The data in TABLE II show that Comparative Regenerator Compositions B and C had greater activity than the Invention Developer Composition even though they contained less sodium silicate than the developer composition.

A run cycle was carried out in a Mercury Mark VI plate processor to process 8000 ft$^2$ (about 741 m$^2$) of imaged KODAK ELECTRA Excel HRO Thermal Plates that had an aluminum substrate that had been coated with poly(vinyl phosphonic acid) before the imageable layer was applied. Although the 50% dots were relatively stable in a cycle where the initial Developer Composition charge was followed by developer replenishment, when the Regenerator Composition was used, the dot sizes were extremely stable to 8000 ft$^2$ (about 741 m$^2$). This demonstrates that the regenerator composition provided consistent developer activity throughout the entire run cycle.

The speed data were obtained by exposing plate regions completely (no image) to IR radiation using a Creo Trendsetter® platesetter. The number reported in TABLE II is the minimum energy required (mJ/cm²) to produce a clean background on the printing plates after development for 30 seconds at 21° C. Less energy was required to provide a clean non-image portion of the printing plates when the Comparative Regenerator Composition B or C was used (that is, these comparative regenerator compositions appear to be more active), compared to the Invention Developer Composition, even though the Comparative Regenerator Compositions B or C contain less sodium metasilicate than the Invention Developer Composition. The cleanout speed data were extremely uniform from start to finish of the cycle and this indicates that the regenerator composition used in the practice of this invention maintained excellent developer activity.

The extremely long run cycle that was run, which was almost three times the recommended cycle for noted Thermal Plates, was exceptional in the results that were obtained. Given that the run cycle could have further continued had more plate material been available, the results are even more extraordinary.

The invention has been described in detail with particular reference to certain preferred embodiments thereof, but it will be understood that variations and modifications can be effected within the spirit and scope of the invention.

The invention claimed is:

1. A method of providing a lithographic printing plate comprising:
    developing an imagewise exposed positive-working imageable element comprising a hydrophilic aluminum-containing substrate with an alkali silicate-containing developer composition having a pH of at least 12 and a conductivity of from about 45 to about 65 mS/cm, said developer also comprising at least 0.2 weight % of one or more water-soluble or water-dispersible polyhydroxy compounds as conductivity reducing agents,
    wherein said developer composition is regenerated by adding to it an alkali silicate-containing regenerator composition having a pH of at least 12 and a conductivity of from about 50 to about 70 mS/cm,
    provided that the conductivity of said regenerator composition is greater than the conductivity of said developer composition by at least 3 mS/cm,
    wherein both of said developer composition and regenerator compositions independently contain from about 0.2 to about 10 weight % of glycerin as a conductivity reducing agent, and both of said developer composition and said regenerator composition further comprise the same or different alkylaminopoly(ethyleneoxy)polypropoxypropanol, wherein the weight ratio of glycerin in said regenerator composition to that in said developer composition is less than 0.95:1.

2. The method of claim 1 wherein the conductivity of said developer composition is suppressed to no more than 50% of the conductivity of said regenerator composition.

3. The method of claim 1 wherein the weight ratio of alkali silicate in said regenerator composition to that in said developer composition is 1:1 or less.

4. The method of claim 1 wherein said positive-working imageable element comprises an alkaline solution removable inner layer comprising an infrared radiation absorbing compound, and an ink-receptive outer layer.

5. The method of claim 1 wherein said imageable element comprises an aluminum-containing substrate that has been treated with a water- or alkaline solution-soluble polymeric composition.

6. The method of claim 1 wherein said imageable element comprises an aluminum substrate that has been treated with polyvinyl phosphonic acid).

7. A method of providing a lithographic printing plate comprising:
    developing an imagewise exposed positive-working imageable element comprising a hydrophilic aluminum-containing substrate with an alkali silicate-containing developer composition having a pH of from about 12.0 to about 13.5 and a conductivity of from about 45 to about 65 mS/cm,
    wherein said developer composition is regenerated by adding to it an alkali silicate-containing regenerator composition having a pH of from about 12.0 to about 13.5 and a conductivity of from about 50 to about 70 mS/cm,
    provided that both said developer and regenerator compositions contain glycerin as a conductivity reducing agent independently in an amount of from about 2 to about 10 weight %, but the weight ratio of glycerin in said regenerator composition to that in said developer composition is less than 0.95:1 so that the conductivity of said developer composition is less than the conductivity of said regenerator composition by at least 3 mS/cm,
    wherein said developer and regenerator compositions independently further comprise from about 0.01 to about 0.2 weight % of an alkylaminopoly(ethyleneoxy)polypropoxypropanol.

8. The method of claim 7 wherein developer composition and regenerator composition further contain the same or different alkali metal alkyl sulfate, but the weight ratio of alkali metal alkyl sulfate in said regenerator composition to that in said developer composition is less than 5:1.

9. The method of claim 1 said developer composition has a cleanout speed of less than 100 mJ/cm².

10. The method of claim 1 wherein said positive-working imageable element is a single-layer positive-working imageable element.

11. A method of providing a lithographic printing plate comprising:
    A) imagewise exposing a single-layer positive-working imageable element, said element comprising an aluminum substrate that has been coated with a poly(vinyl phosphonic acid) and having disposed over said poly(vinyl phosphonic acid) coating, an infrared-radiation-sensitive imageable layer,
    B) with or without a post-exposure baking step, developing said imagewise exposed imageable element with a silicate-containing developer composition comprising glycerin and having a pH of from about 12.5 to about 13.5 and a conductivity of from about 45 to about 65 mS/cm, and
    C) adding to said developer composition a regenerator composition and having a pH of from about 12.5 to about 13.5 and a conductivity of from about 50 to about 70 mS/cm,
        provided that the conductivity of said regenerator composition is higher by at least 3 mS/cm than the conductivity of said developer composition, and
    optionally wherein said developer composition has a cleanout speed of from about 50 to about 90 mJ/cm².

* * * * *